United States Patent [19]

Kawada

[11] Patent Number: 4,764,750
[45] Date of Patent: Aug. 16, 1988

[54] ANALOG-TO-DIGITAL CONVERTER

[75] Inventor: Shigeru Kawada, Tokyo, Japan

[73] Assignee: NEC Corporation, Tokyo, Japan

[21] Appl. No.: 63,896

[22] Filed: Jun. 19, 1987

[30] Foreign Application Priority Data

Jun. 19, 1986 [JP] Japan .................................. 61-144364

[51] Int. Cl.$^4$ .............................................. H03M 1/12
[52] U.S. Cl. ....................... 340/347 AD; 340/347 DA
[58] Field of Search ................. 340/347 DA, 347 AD, 340/347 CC

[56] References Cited

U.S. PATENT DOCUMENTS

4,412,208 10/1983 Akazawa ...................... 340/347 DA
4,476,456 10/1984 Domogalla ................... 340/347 CC
4,503,421 3/1985 Hareyama .................... 340/347 DA Primary Examiner—Charles D. Miller
Attorney, Agent, or Firm—Sughrue, Mion, Zinn, Macpeak, and Seas

[57] ABSTRACT

An analog-to-digital converter includes a plurality of digital-to-analog converting circuits, a control circuit connected to the digital-to-analog converting circuits to control the condition of the respective digital-to-analog converting circuits, a comparator having a first input connected commonly to outputs of the digital-to-analog converting circuits and a second input connected to receive a reference voltage, and a successive approximation register connected to an output of the comparator and adapted to control the control circuit. The control circuit is adapted to generate control signals to the respective digital-to-analog converting circuits in one-to-one relation so that the output potentials of the digital-to-analog converting circuits are successively incremented one after one by a potential corresponding to one bit.

9 Claims, 8 Drawing Sheets

ANALOG-TO-DIGITAL CONVERTER

BACKGROUND OF THE INVENTION

1. Field of the Invention

The present invention relates to an analog-to-digital converter, and more specifically to a successive approximation type analog-to-digital converter which includes a plurality of local digital-to-analog converters of a given resolution and which can provide a resolution higher than the given resolution of the digital-to-analog converter.

2. Description of Related Art

At present, digital technique has been widely used in various fields. As a result, analog-to-digital converters (called "A/D converter" hereinafter) and a digital-to-analog converter (called "D/A converter" hereinafter) become very important as an interface between an analog signal and a digital signal.

Among different types of A/D converters, a successive approximation type A/D converter is known as one which can operate at an intermediate or high speed and can provide a digital signal composed of a relatively large number of bits.

Figure 1:
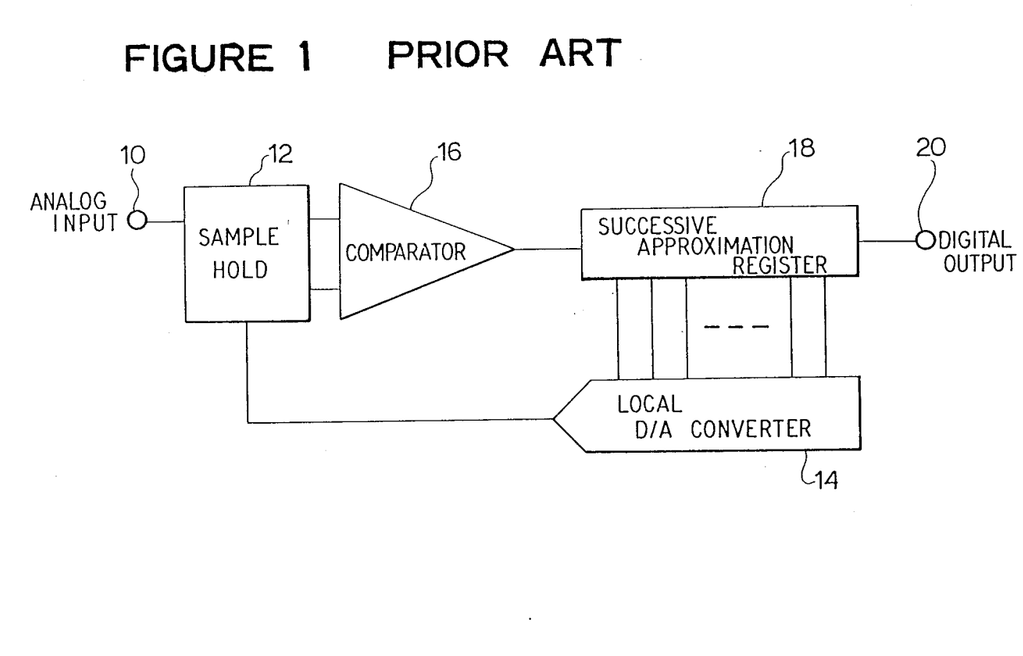
FIG. 1 is a block diagram showing one example of the conventional successive approximation A/D converter.

Referring to FIG. 1, there is shown a block diagram of a typical example of a conventional successive approximation type A/D converter. The shown A/D converter includes an analog signal input terminal 10 connected to a first input of a sample and hold circuit 12, which has a second input connected to an output of a local D/A converter 14. The sample and hold circuit 12 has a pair of outputs corresponding to the pair of inputs, these outputs being connected to a pair of inputs of a comparator 16, whose output is connected to a successive approximation register 18. This register 18 has parallel outputs connected to the local D/A converter 14. Further, a serial output of the register 18 is connected to a digital signal output terminal 20.

With this arrangement, the local D/A converter is so set to generate a voltage $V_{FS}/2$ corresponding to a half of the full scale voltage $V_{FS}$ when it receives the parallel output of the register 18 composed of the most significant bit (MSB) of "1" and the other bits of "0". In this condition, the voltage of the analog signal held in the sample and hold circuit 12 is compared with the output voltage $V_{FS}/2$ of the local D/A converter by the comparator 16. The result of comparison is outputted to the successive approximation register 18, which changes its content, i.e., a digital data to be supplied to the local D/A converter 14. For example, when the input analog signal is larger than $V_{FS}/2$, the MSB of the register 18 is maintained at "1" as it is, and the second significant bit (2SB) is changed to "1" from "0". The other bits are maintained at "0". Accordingly, the output voltage of the D/A converter 14 is brought into 3 $V_{FS}/4$. On the other hand, when the input analog signal is smaller than $V_{FS}/2$, the MSB and 2SB of the register 18 are changed to "0" and "1", respectively, and the other bits are maintained at "0". In this case, the D/A converter 14 generates $V_{FS}/4$. Thus, the value of the MSB is determined, and then, the next comparison is made between the input analog signal and the reference voltage $V_{FS}/4$ or 3 $V_{FS}/4$ of the local D/A converter 14, so that the 2SB will be determined. Thus, similar operation will be repeated to successively determine each bit of the digital data until the least significant bit (LSB) is determined.

In the above mentioned successive approximation A/D converter, the local D/A converter is generally divided into two types, one of which includes a resistor string or ladder and the other of which includes a capacitor array.

At present, D/A converters, which have a resolution of 8 bits to 10 bits and which can be used as the local D/A converter 14 in the above mentioned conventional successive approximation A/D converter, can be manufactured in mass production manner with high reliability and stability in accordance with recent advanced integrated circuit technique. Therefore, A/D converters having a relatively small bit number can be manufactured with reliability.

However, components fabricated on an integrated circuit have a certain limit in uniformity of characteristics, and therefore, it is the present status that it is difficult to obtain a D/A converter having a higher resolution. For example, in order to obtain a D/A converter having a resolution of 12 bits to 16 bits, it is necessary to constitute a circuit with discrete parts such as resistors and capacitors of the accuracy matching with the required resolution. Otherwise, it is necessary to use a fine adjustment means such as a Laser trimming. In this case, however, the cost for forming required elements becomes very large, and also, elements having a sufficient reliability cannot be obtained.

As mentioned above, in the case that a D/A converter of a large bit number is constituted in combination with a single resistor string or ladder or a single capacitor array, a sufficient accuracy cannot be obtained because the D/A converter cannot maintain a monotonic increase over the full range because of dispersion of element characteristics. For overcoming this problem, there has been proposed to use a plurality of D/A converters in parallel. For example, if two D/A converters are combined in parallel, the combined D/A converter can have a full scale corresponding to the sum of respective full scales of the two unitary D/A converters. Assuming that first and second unitary D/A converters have full scales FS1 and FS2, respectively, the combined D/A converter has a full scale FS equal to (FS1+FS2).

In the combined D/A converter, the first unitary D/A converter will increment its output in response to increment of a digital input. When the MSB of the digital input changes from "0" to "1", the logic value "1" is supplied to all input bits of the first unitary D/A converter so that it outputs its full scale FS1. Thereafter, the second unitary D/A converter will increment in response to increment of the digital input, so that the output of the second D/A converter is added to the output of the first D/A converter to provide a combined output.

Further, an interpolation type which uses a master D/A converter and a slave D/A converter has been proposed. In this case, one step of the master D/A converter is divided further finely by the slave D/A converter.

However, the first mentioned accumulation method using a plurality of unitary D/A converters in parallel is disadvantageous in that a gain error of each unitary D/A converter is accumulated, with the result that the overall D/A converter has a large error in total linearity. On the other hand, the interpolation type has such a defect that it cannot have a monotonic increase if a slave D/A converter has an increased step error.

SUMMARY OF THE INVENTION

Accordingly, it is an object of the present invention to provide an A/D converter which has overcome the above mentioned drawbacks of the conventional ones.

Another object of the present invention is to provide a successive approximation A/D converter which uses a plurality of D/A converters but which does not have a large gain error as a whole.

A further object of the present invention is to provide a successive approximation A/D converter which includes a plurality of D/A converters and has an improved linearity error.

The above and other objects of the present invention have been achieved in accordance with the present invention by an analog-to-digital converter which includes a plurality of digital-to-analog converting circuits, a control circuit connected to the digital-to-analog converting circuits to control the condition of the respective digital-to-analog converting circuits, a comparator having a first input connected commonly to outputs of the digital-to-analog converting circuits and a second input connected to receive a reference voltage, and a successive approximation register connected to an output of the comparator and adapted to control the control circuit, characterized in that the control circuit is adapted to generate control signals to the respective digital-to-analog converting circuits in one-to-one relation so that the output potentials of the digital-to-analog converting circuits are successively incremented one after one by a potential corresponding to one bit.

Preferably, each of the digital-to-analog converting circuit includes a charge redistribution binary weighted capacitor array. Specifically, each capacitor array is composed of a plurality of weighted capacitance capacitors which has not only charge redistribution function but also sample and hold function. Further, the second input of the comparator is connected to one terminal of a capacitor means whose other terminal is connected to the reference voltage, the capacitor means having a capacitance equal to the total capacitance of all the capacitors included in all of the digital-to-analog converting circuits.

The above and other objects, features and advantages of the present invention will be apparent from the following description of preferred embodiments of the invention with reference to the accompanying drawings.

DESCRIPTION OF THE PREFERRED EMBODIMENTS

Figure 2:
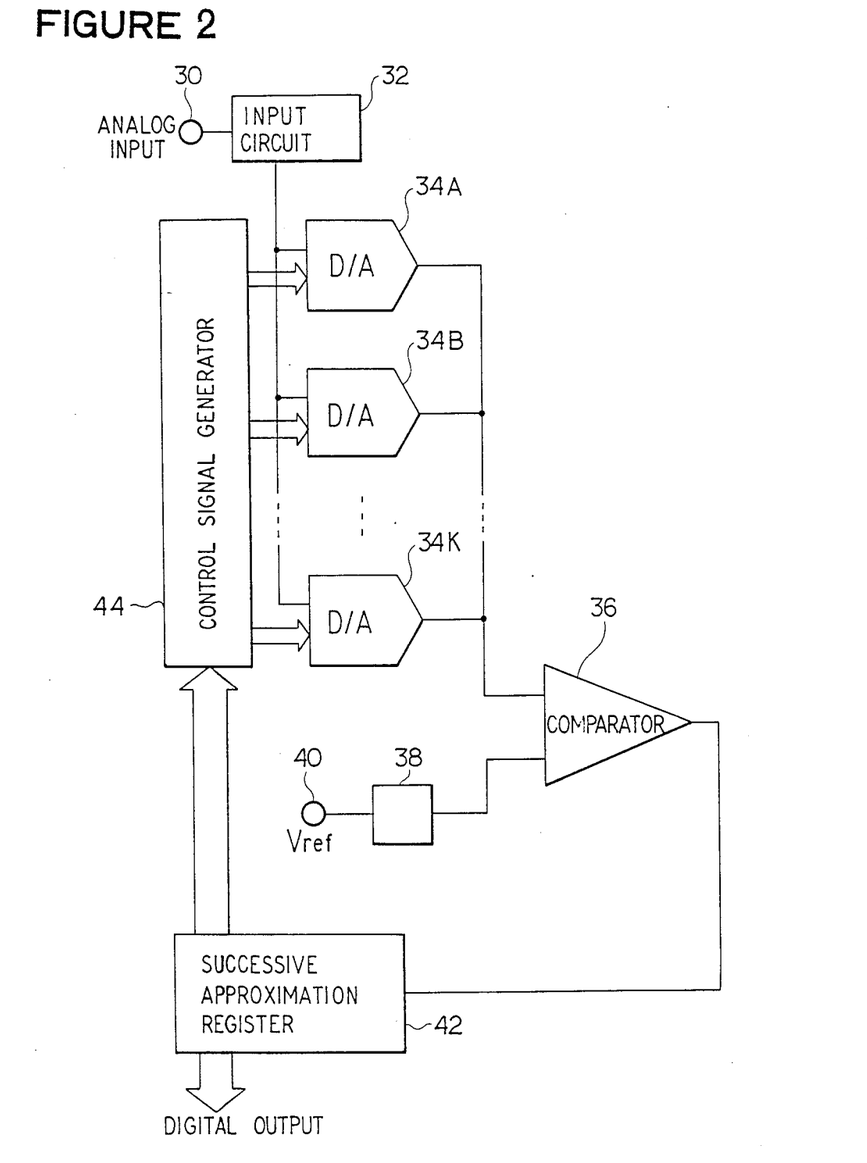
FIG. 2 is a block diagram showing a basic construction of the successive approximation A/D converter in accordance with the present invention.

Referring to FIG. 2, there is shown a conceptual structure of the successive approximation A/D converter in accordance with the present invention. The shown A/D converter includes an analog signal input terminal 30 connected to an analog signal input circuit 32. This input circuit 32 has an output connected commonly to a plurality of local D/A converters 34A to 34K of the charge redistribution type which has a capacitor array functioning a charge redistribution and sample and hold capacitor for the first bit to the bit of $2^m$. These local D/A converter has a resolution of "l" bits. Outputs of all the D/A converters 34A to 34K are connected commonly to one input of the comparator 36.

This comparator 36 has another input connected to a capacitor 38, which is in turn connected to a reference potential terminal 40. The comparator 36 is connected at its output to a successive approximation register 42. This register 42 has parallel outputs connected to a generator 44 which supplies switch control signals to all the local D/A converters 34A to 34K so as to cause the respective D/A converters to change their internal condition. Further, the register 42 is adapted to output an digital signal of n bits. In this construction, the relation of $n = l + m$ and $K = 2^m$ is established.

With this arrangement, an analog signal is supplied from the input terminal 30 through the input circuit 32 to all the first to the $k^{th}$ local D/A converters 34A to 34K. Specifically, the analog signal is sampled in the capacitor array of each D/A converters controlled by the control signal generator 44. Then, the analog signal input circuit 32 is cut off so that the analog signal is held in the respective capacitor array. Thereafter, comparison between the outputs of all the D/A converters and the reference potential is made by the comparator 36, and the content of the register 42 is modified on the basis of the comparison result. In response to the content of the register 42, the generator 44 generates such control signals to the D/A converters 34A to 34K that the condition of the capacitor arrays is successively modified one by one comparison. Thus, a digital signal of n bits is finally outputted from the register 42.

Figure 3:
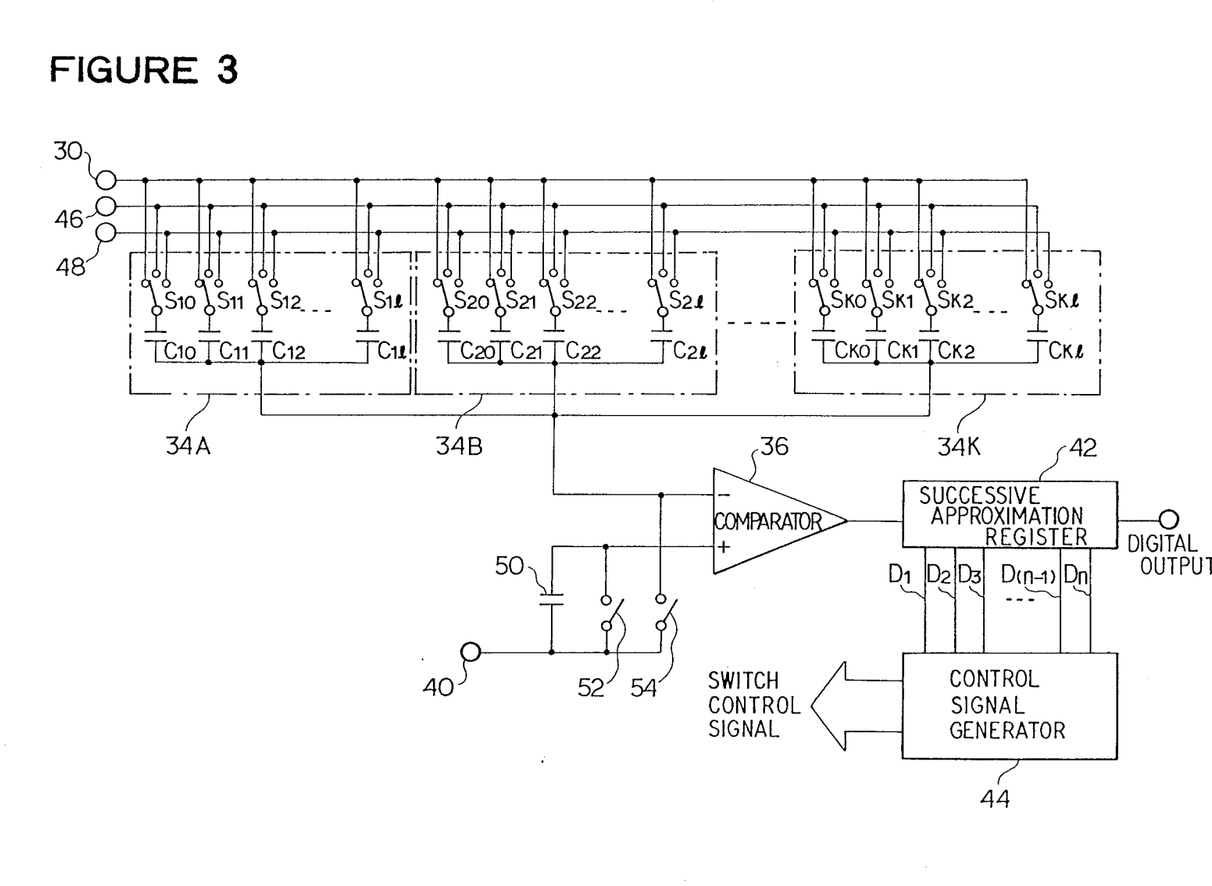
FIG. 3 is a more detailed block diagram of the A/D converter shown in FIG. 2.

Turning to FIG. 3, the register 42 has parallel bit outputs supplying n-bit data $D_1, D_2, D_3 \ldots D_{n-1}$ and $D_n$ to the generator 44. On the other hand, the first D/A converter 34A includes a capacitor array composed of $(l+1)$ capacitors $C_{10}$ to $C_{1l}$ which function as a charge redistribution and sample and hold capacitor. One electrodes of these capacitors $C_{10}$ to $C_{1l}$ are connected to each other. The other electrode of each capacitor $C_{10}$ to $C_{1l}$ is connected to a common terminal of a single pole triple throws switch $S_{10}$ to $S_{1l}$. Each of the switches $S_{10}$ to $S_{1l}$ has a first selection terminal connected to the analog signal input terminal 30, a second selection terminal connected to a first reference potential terminal 46, and a third selection terminal connected to a second reference potential terminal 48. Similarly, the second D/A converter 34B includes a capacitor array of $(l+1)$ capacitors $C_{20}$ to $C_{2l}$ and associated switches $S_{20}$ to $S_{2l}$ connected as shown. Further, the other D/A converters each includes $(l+1)$ capacitors and $(l+1)$ associated switches. The commonly connected electrodes of the capacitors of each D/A converters 34A to 34K are also connected commonly to one input of the comparator 36.

The other input of the comparator 36 is connected through a capacitor 50 to a third reference potential terminal 40. The capacitor 50 is shunted by a switch 52, and the third reference potential terminal 40 is connected through another switch 54 to the one input of the comparator 36.

The above capacitors are in the following relation: The capacitor 50 has a capacitance $C_c$ equal to the total capacitance of all capacitors $C_{10} \sim C_{1l}$, $C_{20} \sim C_{2l}$, ... $C_{ko} \sim C_{kl}$ included in all the D/A converters 34A to 34K. Further, assuming that a unitary capacitance is C, the capacitors $C_{10} \sim C_{1l}$, $C_{20} \sim C_{2l}$, ..., $C_{ko} \sim C_{kl}$ of each of the first to $K^{th}$ D/A converters 34A to 34K are weighted to have capacitances C, C, 2C, ..., and $2^{(l-1)}$C, respectively. Therefore, $C_c = (K \times 2^l)C$.

Before explaining the operation of the embodiment, description will be made on operation of a combined D/A converter which receive n bit data and which includes two (n−1) bit D/A converters, with reference to FIG. 4.

The n bit data DATA-A is divided into a portion of only LSB (the $n^{th}$ bit) and a portion of $(n-1)^{th}$ bit to MSB. The latter portion is supplied as a (n−1) bit data DATA-B to one D/A converter DAC-2, and also inputted to a digital adder ADD-1. This adder adds the LSB of DATA-A to the LSB of DATA-B (i.e., the $(n-1)^{th}$ bit of DATA-A) and supplies the result of addition as another (n−1) bit data DATA-C to another D/A converter DAC-1. Outputs of the two D/A converters DAC-1 and DAC-2 are inputted to an analog adder ADD-2 which generates an analog signal corresponding to the input digital signal DATA-A.

Now, assuming n=6, the digital data DATA-A, DATA-B and DATA-C are under the relation shown in the following TABLE-1.

TABLE 1

| | "A" (6 Bits) | "B" (5 Bits) | "C" (5 Bits) |
|---|---|---|---|
| 63 | 111111 | 11111 | 100000 |
| 62 | 111110 | 11111 | 11111 |
| 61 | 111101 | 11110 | 11111 |
| 60 | 111100 | 11110 | 11110 |
| 59 | 111011 | 11101 | 11110 |
| 58 | 111010 | 11101 | 11101 |
| 57 | 111001 | 11100 | 11101 |
| 56 | 111000 | 11100 | 11100 |
| 55 | 110111 | 11011 | 11100 |
| 54 | 110110 | 11011 | 11011 |
| . | . | . | . |
| 36 | 100100 | 10010 | 10010 |
| 35 | 100011 | 10001 | 10010 |
| 34 | 100010 | 10001 | 10001 |
| 33 | 100001 | 10000 | 10001 |
| 32 | 100000 | 10000 | 10000 |
| 31 | 011111 | 01111 | 10000 |
| 30 | 011110 | 01111 | 01111 |
| 29 | 011101 | 01110 | 01111 |
| 28 | 011100 | 01110 | 01110 |
| . | . | . | . |
| 9 | 001001 | 00100 | 00101 |
| 8 | 001000 | 00100 | 00100 |
| 7 | 000111 | 00011 | 00100 |
| 6 | 000110 | 00011 | 00011 |
| 5 | 000101 | 00010 | 00011 |
| 4 | 000100 | 00010 | 00010 |
| 3 | 000011 | 00001 | 00010 |
| 2 | 000010 | 00001 | 00001 |
| 1 | 000001 | 00000 | 00001 |
| 0 | 000000 | 00000 | 00000 |

As seen from the above TABLE-1, the (n−1) bit digital inputs to the D/A converters DAC-1 and DAC-2 are alternatively and successively incremented dependently upon the LSB of the input digital data.

Now, assume that the D/A converter DAC-1 has a gain of K, and the D/A converter DAC-2 has a gain of K-ΔK (where ΔK is a gain error between the DAC-1 and DAC-2). Further, assume n−1=l. Under this condition, the gain error appears at each increment of logic input, differently from the conventional accumulation manner using a plurality of D/A converters in parallel. However, the amount of error is compressed to $\frac{1}{2^l}$. The reason for this is that the amount to be successively and alternatively incremented corresponds to the LSB of each D/A converter and therefore is equal to one step amount which can be obtained by dividing the full scale of the D/A converter output by $2^l$. Therefore, the gain error is also compressed at the same ratio.

Reviewing in detail, the outputs $V_1$ and $V_2$ of the DAC-1 and DAC-2 can be expressed as follows:

$$V_1 = K \left( \frac{1}{2} a_2 + \frac{1}{4} a_3 + \ldots + \frac{1}{2^l} \right) V_{REF}$$

$$V_2 = (K - \Delta K) \left( \frac{1}{2} a_2 + \frac{1}{4} a_3 + \ldots + \frac{1}{2^l} \right) V_{REF}$$

where $V_{REF}$ is a reference potential supplied to DAC-1 and DAC-2.

Therefore, in the conventional accumulation method, the full scale output $V_{FS}$ is $$V_{FS} = (2k - \Delta K) V_{REF}$$

Thus, an ideal half scale output of the combined D/C converter is expressed:

$$\tfrac{1}{2} V_{FS} = (k - \tfrac{1}{2}\Delta K) V_{REF}$$

On the other hand, an actual half scale output $V_{HS}$ of the combined D/C converter appears when only one of the two D/C converters, for example, DAC-1 is put in the full scale condition. The actual half scale output $V_{HF}$ is expressed as follows:

$$V_{HF} = K \cdot V_{REF}$$

Accordingly, the linearity error $V_{LE(HS)}$ in the half scale is expressed:

$$V_{LE(HS)} = V_{HS} - \tfrac{1}{2} V_{FS} = \tfrac{1}{2} \Delta K \cdot V_{REF}$$

The ratio L.E. of $V_{LE(HS)}$ to the full scale is as follows:

$$\begin{aligned} L.E. &= V_{LE(HS)}/V_{FS} \\ &= \tfrac{1}{2}\Delta K/(2K - \Delta K) \approx \tfrac{1}{4} \cdot \frac{\Delta K}{K} \end{aligned}$$

Figure 4:
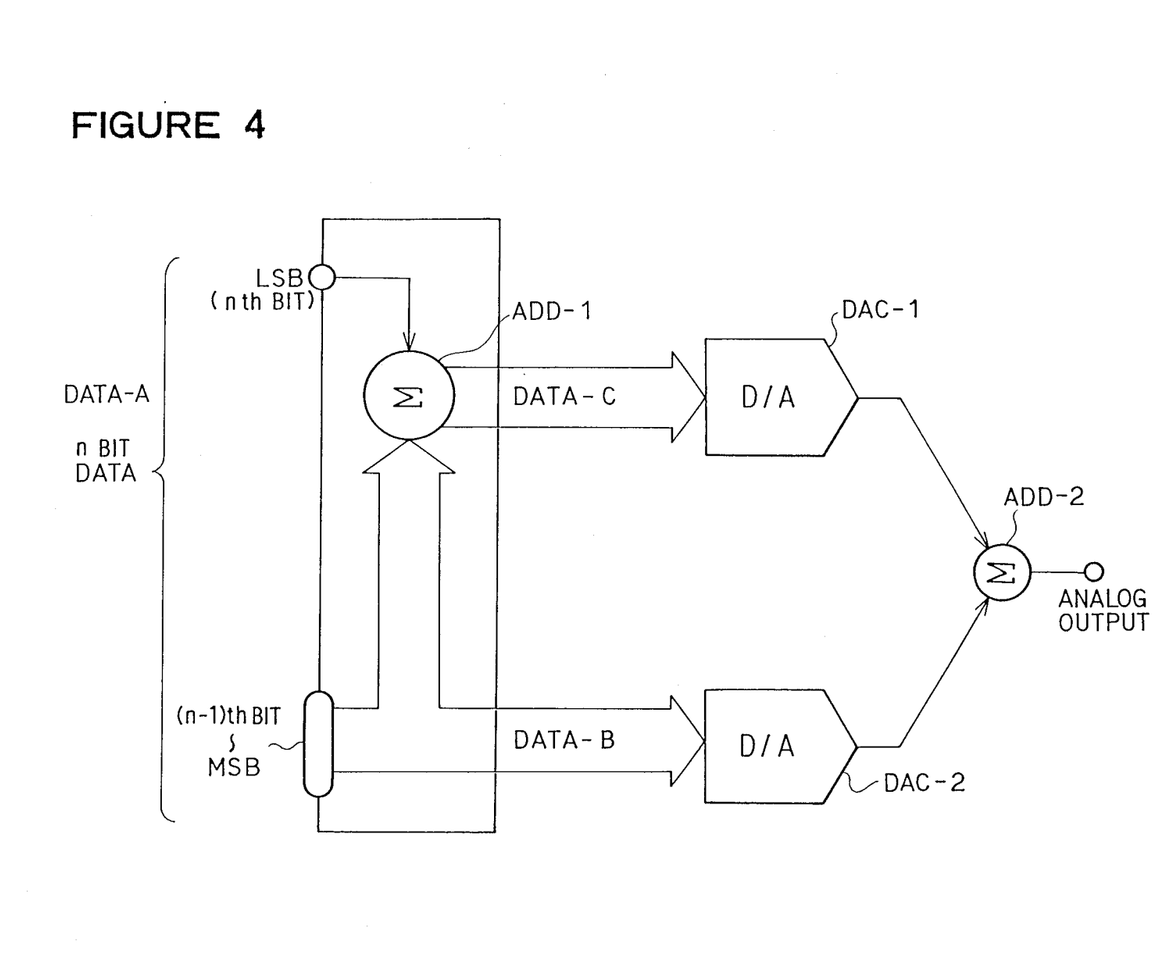
FIG. 4 is a diagram illustrating a basic conception of the A/D converter shown in FIG. 2.

On the other hand, the full scale voltage $V_{FS}$ in the combined D/A converter shown in FIG. 4 is expressed as follows:

$$V_{FS} = (2K - \Delta K)V_{REF}$$

Namely, this is similar to that of the conventional accumulation method. Further, the magnitude of change $V_{STEP}$ caused by the LSBs of the DAC-1 and DAC-2 is expressed:

$$V_{STEP(1)} = K \cdot V_{REF}/2^l$$

$$V_{STEP(2)} = (K - \Delta K) \cdot V_{REF}/2^l$$

The linearity error due to the gain error will therefore appear at every two steps over the whole of the dynamic range. But, the magnitude of the error is compressed.

As ideal neutral point potential of the two steps can be expressed:

$$V_{STEP}/2 = \left(k - \frac{\Delta K}{2}\right) V_{REF}/2^l$$

But, the actual neutral point potential is as follows:

$$V_{STEPA}/2 = (K - \Delta K)V_{REF}/2^l$$

Accordingly, the linearity error $V_{LE}$ can be expressed:

$$V_{LE} = \frac{V_{STEP}}{2} - \frac{V_{STEPA}}{2}$$
$$= \frac{\Delta K}{2} \cdot V_{REF}/2^l$$

The ratio L.E. can be expressed:

$$L.E. = \frac{V_{LE}}{V_{FS}} = \frac{2}{2K - \Delta K} \cdot \frac{\Delta K}{2} \cdot \frac{1}{2^l} \approx \frac{1}{4} \cdot \frac{1}{2^l} \cdot \frac{\Delta K}{K}$$

As seen from the above, the ratio L.E. of the combined D/A converter in accordance with the present invention is compressed to $\frac{1}{2^l}$ in comparison to the conventional accumulation method.

Figure 5:
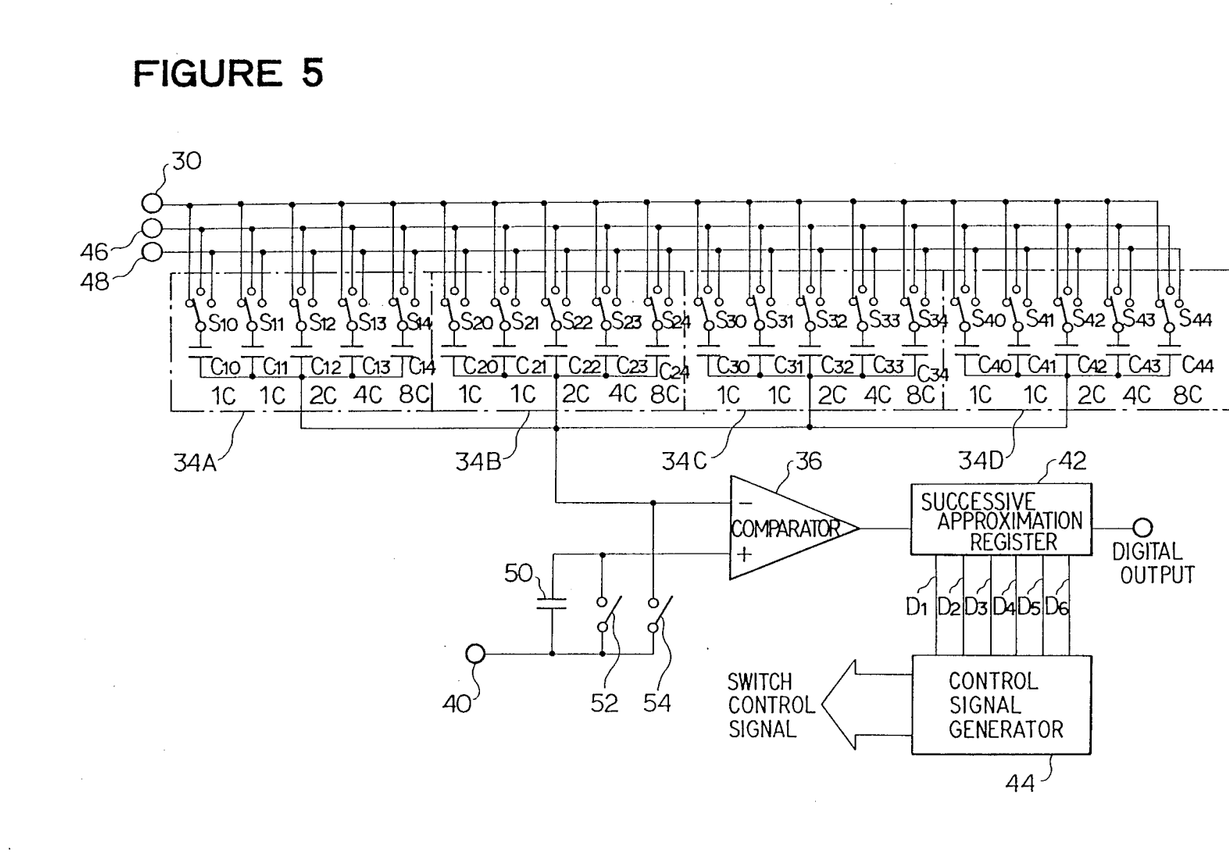
FIG. 5 is a diagram similar to FIG. 3 but showing a first embodiment of the successive approximation A/D converter in accordance with the present invention.

Referring to FIG. 5, there is shown one embodiment of the A/D converter in accordance with the present invention. In FIG. 4, elements similar to those shown in FIG. 3 are given the same Reference Numerals, and explanation will be omitted. For simplification of drawing and explanation, the shown A/D converter is adapted to output a 6 bit digital signal. Namely, n=6. Further, the shown converter is constructed on the condition of l=4, m=2 and K=$2^2$=4. In the first embodiment shown in FIG. 5, further, a voltage $V_R$ is applied to the first reference potential terminal 46, and the second reference potential terminal 48 is grounded. In addition, a voltage $V_R/2$ is applied to the third reference potential terminal 40. Under these conditions, four local D/A converters 34A, 34B, 34C and 34D are provided, and the capacitances of the capacitors included in a capacitor array of each D/A converter are determined to fulfil the following relation:

$$C_{10} = C_{11} = C_{20} = C_{21} = C_{30} = C_{31} = C_{40} = C_{41} = 1C.$$
$$C_{12} = C_{22} = C_{32} = C_{42} = 2C.$$

-continued
$$C_{13} = C_{23} = C_{33} = C_{43} = 4C.$$
$$C_{14} = C_{24} = C_{34} = C_{44} = 8C.$$

Therefore, the capacitor 50 has a capacitance $C_c$ of 64C.

Next, an A/D conversion operation will be explained. First, all the switches $S_{10} \sim S_{14}$, $S_{20} \sim S_{24}$, $S_{30} \sim S_{34}$ and $S_{40} \sim S_{44}$ are controlled to connect the analog signal input 30, and the switches 52 and 54 are closed. In this condition, an analog signal $V_{in}$ applied to the input 30 is sampled in all the capacitor arrays of the D/A converters 34A to 34D in comparison to the third reference potential $V_R/2$.

Next, the switches 52 and 54 are turned off, and at the same time, the bit data $D_1$ to $D_6$ of the successive approximate register 42 is changed to such a condition that $D_1$="1" and $D_2 \sim D_6$="0". As a result, all the switches $S_{10} \sim S_{14}$, $S_{20} \sim S_{24}$, $S_{30} \sim S_{34}$, $S_{40} \sim S_{44}$ are separated from the analog signal input 30. In addition, since the bit data $D_1$ is brought to "1", all the switches $S_{14}$, $S_{24}$, $S_{34}$ and $S_{44}$ connected to the capacitors $C_{14}$, $C_{24}$, $C_{34}$ and $C_{44}$ of the capacitance 8C are connected to the first reference potential terminal 46 of the potential $V_R$. Since the other bit data $D_2$ to $D_6$ are kept at "0", the other switches $S_{10} \sim S_{13}$, $S_{20} \sim S_{23}$, $S_{30} \sim S_{33}$ and $S_{40} \sim S_{43}$ are connected to the second reference potential terminal 48 of the ground level. In this condition, comparison is made by the comparator 36. Namely, there has been performed a comparison step for the most significant bit (MSB) in the successive approximation system.

Now, assuming that the respective potentials of the inverted input and the non-inverted input of the comparator 36 are $V_I$ and $V_N$, respectively, the following relation can be formed:

$$V_N = V_R/2$$

$$\left(\frac{V_R}{2} - V_{IN}\right)64C = (V_I - V_R)32C + (V_I - 0)32C$$

$$V_I = V_R - V_{IN}$$

In case of $V_{IN} > V_R/2$, the comparator 36 will output a logic signal of "1". To the contrary, if $V_{IN} < V_R/2$, the comparator 36 outputs a logic signal of "0". The logic output of the comparator 36 is applied to the successive approximation register 42, and as a result, the operation will enter the comparison step for the second significant bit (2SB). Specifically, with $V_{IN} > V_R/2$, the bit data $D_1$ and $D_2$ are put at "1" and the other bit data $D_3$ to $D_6$ are put at "0", with the result that the switches $S_{13}$, $S_{14}$, $S_{24}$, $S_{34}$ and $S_{44}$ are connected to the first reference potential $V_R$, and the other switches $S_{10} \sim S_{12}$, $S_{20} \sim S_{23}$, $S_{30} \sim S_{33}$ and $S_{40} \sim S_{43}$ are connected to the second reference potential of the ground level. In this condition, the following relation is established:

$$V_N = V_R/2$$

$$\left(\frac{V_R}{2} - V_{IN}\right)64C = (V_I - V_R)(32C + 16C) + (V_I - 0)16C$$

$$V_I = \frac{5}{4} V_R - V_{IN}$$

As a result, if $V_{IN} > 3\, V_R/4$, the comparator 36 outputs a signal of "1". On the other hand, if $V_{IN} < 3\, V_R/4$, the comparator 36 generates a signal of "0". The output of the comparator 36 is applied to the successive approximation register 42.

The above operation will be repeated until the comparison for the least significant bit (LSB) is executed. The comparison result for the LSB is then inputted to the successive approximation register 42, and so, the content of the register is outputted through the output terminal as the result of the A/D conversion.

The following TABLE 2 and TABLE 3 indicate the correspondence between the bit data $D_1 \sim D_6$ and the position of the switches of all the D/A converters which can be taken in the course of the successive approximation operation. In these tables, "1" appearing in the switch position columns indicates that the switch is connected to the first reference potential, and "0" appearing in the switch position columns shows the switch is connected to the second reference potential.

TABLE 2

| $D_1 D_2 D_3 D_4 D_5 D_6$ BIT + DATA | $S_{14} S_{13} S_{12} S_{11} S_{10}$ D/A CONVERTER 34A | $S_{24} S_{23} S_{22} S_{21} S_{20}$ D/A CONVERTER 34B | $S_{34} S_{33} S_{32} S_{31} S_{30}$ D/A CONVERTER 34C | $S_{44} S_{43} S_{42} S_{41} S_{40}$ D/A CONVERTER 34D |
|---|---|---|---|---|
| 011111 | 12222 | 12222 | 12222 | 21112 |
| 011110 | 12222 | 12222 | 21112 | 21112 |
| 011101 | 12222 | 21112 | 21112 | 21112 |
| 011100 | 21112 | 21112 | 21112 | 21112 |
| 011011 | 21112 | 21112 | 21112 | 21122 |
| 011010 | 21112 | 21112 | 21122 | 21122 |
| 011001 | 21112 | 21122 | 21122 | 21122 |
| 011000 | 21122 | 21122 | 21122 | 21122 |
| 010111 | 21122 | 21122 | 21122 | 21212 |
| 010110 | 21122 | 21122 | 21212 | 21212 |
| 010101 | 21122 | 21212 | 21212 | 21212 |
| 010100 | 21212 | 21212 | 21212 | 21212 |
| 010011 | 21212 | 21212 | 21212 | 21222 |
| 010010 | 21212 | 21212 | 21222 | 21222 |
| 010001 | 21212 | 21222 | 21222 | 21222 |
| 010000 | 21222 | 21222 | 21222 | 21222 |
| 001111 | 21222 | 21222 | 21222 | 22112 |
| 001110 | 21222 | 21222 | 22112 | 22112 |
| 001101 | 21222 | 22112 | 22112 | 22112 |
| 001100 | 22112 | 22112 | 22112 | 22112 |
| 001011 | 22112 | 22112 | 22112 | 22122 |
| 001010 | 22112 | 22112 | 22122 | 22122 |
| 001001 | 22112 | 22122 | 22122 | 22122 |
| 001000 | 22122 | 22122 | 22122 | 22122 |
| 000111 | 22122 | 22122 | 22122 | 22212 |
| 000110 | 22122 | 22122 | 22212 | 22212 |
| 000101 | 22122 | 22212 | 22212 | 22212 |
| 000100 | 22212 | 22212 | 22212 | 22212 |
| 000011 | 22212 | 22212 | 22212 | 22222 |
| 000010 | 22212 | 22212 | 22222 | 22222 |
| 000001 | 22212 | 22222 | 22222 | 22222 |
| 000000 | 22222 | 22222 | 22222 | 22222 |

TABLE 3

| | | | | |
|---|---|---|---|---|
| 111111 | 11111 | 11111 | 11111 | 11112 |
| 111110 | 11111 | 11111 | 11112 | 11112 |
| 111101 | 11111 | 11112 | 11112 | 11112 |
| 111100 | 11112 | 11112 | 11112 | 11112 |
| 111011 | 11112 | 11112 | 11112 | 11122 |
| 111010 | 11112 | 11112 | 11122 | 11122 |
| 111001 | 11112 | 11122 | 11122 | 11122 |
| 111000 | 11122 | 11122 | 11122 | 11122 |
| 110111 | 11122 | 11122 | 11122 | 11212 |
| 110110 | 11122 | 11122 | 11212 | 11212 |
| 110101 | 11122 | 11212 | 11212 | 11212 |
| 110100 | 11212 | 11212 | 11212 | 11212 |
| 110011 | 11212 | 11212 | 11212 | 11222 |
| 110010 | 11212 | 11212 | 11222 | 11222 |
| 110001 | 11212 | 11222 | 11222 | 11222 |
| 110000 | 11222 | 11222 | 11222 | 11222 |
| 101111 | 11222 | 11222 | 11222 | 12112 |
| 101110 | 11222 | 11222 | 12112 | 12112 |
| 101101 | 11222 | 12112 | 12112 | 12112 |
| 101100 | 12112 | 12112 | 12112 | 12112 |
| 101011 | 12112 | 12112 | 12112 | 12122 |
| 101010 | 12112 | 12112 | 12122 | 12122 |
| 101001 | 12112 | 12122 | 12122 | 12122 |
| 101000 | 12122 | 12122 | 12122 | 12122 |
| 100111 | 12122 | 12122 | 12122 | 12212 |
| 100110 | 12122 | 12122 | 12212 | 12212 |
| 100101 | 12122 | 12212 | 12212 | 12212 |
| 100100 | 12212 | 12212 | 12212 | 12212 |
| 100011 | 12212 | 12212 | 12212 | 12222 |
| 100010 | 12212 | 12212 | 12222 | 12222 |
| 100001 | 12212 | 12222 | 12222 | 12222 |

TABLE 3-continued

| 100000 | 12222 | 12222 | 12222 | 12222 |
|---|---|---|---|---|
| $D_1\ D_2\ D_3\ D_4\ D_5\ D_6$ | $S_{14}\ S_{13}\ S_{23}\ S_{22}\ S_{11}\ S_{10}$ | $S_{24}\ S_{23}\ S_{22}\ S_{21}\ S_{20}$ | $S_{34}\ S_{33}\ S_{32}\ S_{31}\ S_{30}$ | $S_{44}\ S_{43}\ S_{42}\ S_{41}\ S_{40}$ |
| BIT + DATA | D/A CONVERTER 34A | D/A CONVERTER 34B | D/A CONVERTER 34C | D/A CONVERTER 34D |

Figure 6:
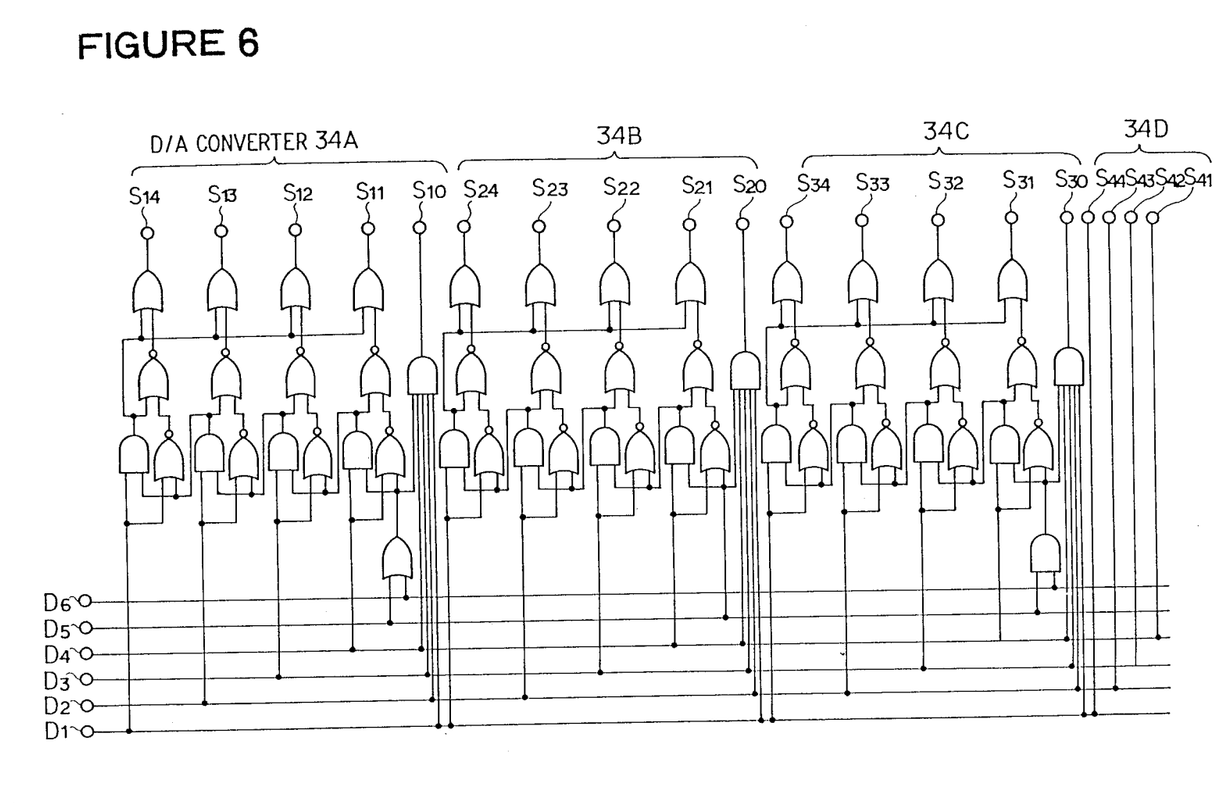
FIG. 6 is a circuit diagram of a switch control signal generator incorporated in the A/D converter shown in FIG. 5.

Turning to FIG. 6, there is shown a circuit of the control signal generator 44 which can control the switches $S_{10} \sim S_{14}$, $S_{20} \sim S_{24}$, $S_{30} \sim S_{34}$ and $S_{40} \sim S_{44}$ in accordance with the TABLE 2 and TABLE 3. The generator 44 has a 6 bit parallel input for receiving the bit data $D_1 \sim D_6$ of the successive approximation register 42. The generator 44 comprises a number of AND gates, OR gates and NOR gates connected as shown to form a decoder which generates logic signals $S_{10} \sim S_{44}$ for control of switches in accordance with the TABLE 2 and the TABLE 3. When the logic signals $S_{10} \sim S_{44}$ are at "1", the switch is connected to the first reference potential. On the other hand, with the logic signal of "0", the switch is connected to the second reference potential.

Figure 7:
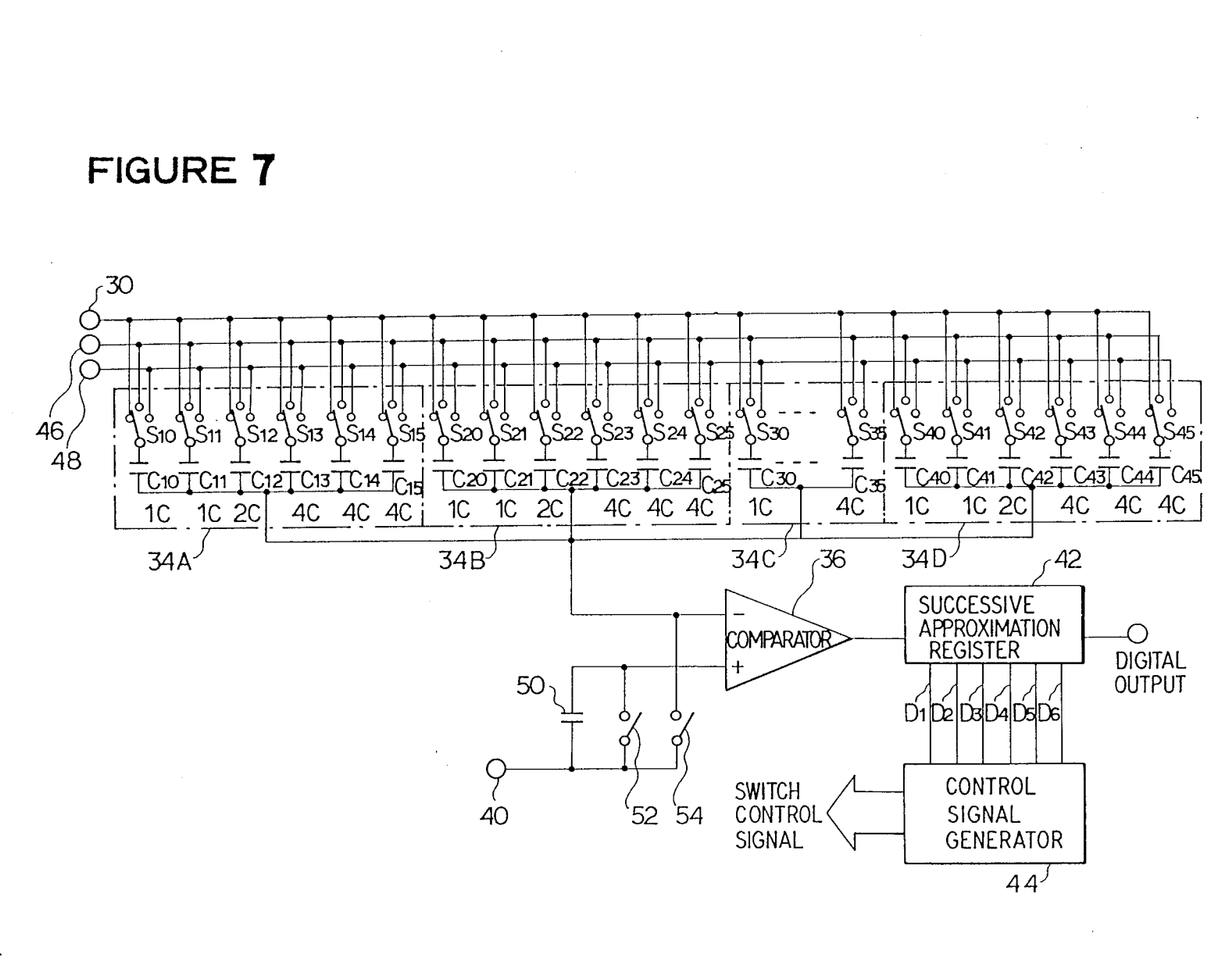
FIG. 7 is a diagram similar to FIG. 3 but showing a second embodiment of the successive approximation A/D converter.

Referring to FIG. 7, there is shown another embodiment of the 6 bit A/D converter in accordance with the present invention. In this figure, elements similar to those shown in FIG. 5 are given the same Reference Numerals, and explanation will be omitted.

In this embodiment, each of the local D/A converters 34A to 34D has six charge redistribution and sample and hold capacitors $C_{10} \sim C_{15}$, $C_{20} \sim C_{25}$, $C_{30} \sim C_{35}$ and $C_{40} \sim C_{45}$ and six associated switches $S_{10} \sim S_{15}$, $S_{20} \sim S_{25}$, $S_{30} \sim S_{35}$ and $S_{40} \sim S_{45}$. The capacitors of the respective capacitor arrays have capacitances fulfiling the following relation.

$$C_{10} = C_{11} = C_{20} = C_{21} = C_{30} = C_{31} = C_{40} = C_{41} = 1C,$$
$$C_{12} = C_{22} = C_{32} = C_{42} = 2C,$$
$$C_{13} = C_{14} = C_{15} = C_{23} = C_{24} = C_{25} = C_{33} = C_{34} =$$
$$C_{35} = C_{43} = C_{44} = C_{45} = 4C,$$

Therefore, the capacitor 50 has a capacitance of 64C, similarly to the embodiment shown in FIG. 5.

In the second embodiment shown in FIG. 7, the capacitors incorporated in the local D/A converters has a capacitance of 1C at minimum and a capacitance of 4C at maximum. Therefore, in the case that the A/D converter is fabricated on an integrated circuit, the capacitors can be formed with a high relative precision in capacitance, and therefore, a high A/D conversion accuracy can be obtained.

The following TABLE 4 and TABLE 5 indicate the correspondence between the bit data $D_1 \sim D_6$ of the register 42 and the position of the switches $S_{10} \sim S_{45}$ in the case of the second embodiment shown in FIG. 7. "1" and "2" in the switch position columns have the same meanings as those in TABLE 2 and TABLE 3.

TABLE 4

| 011111 | 211222 | 211222 | 211222 | 221112 |
|---|---|---|---|---|
| 011110 | 211222 | 211222 | 221112 | 221112 |
| 011101 | 211222 | 221112 | 221112 | 221112 |
| 011100 | 221112 | 221112 | 221112 | 221112 |
| 011011 | 221112 | 221112 | 221112 | 221122 |
| 011010 | 221112 | 221112 | 221122 | 221122 |
| 011001 | 221112 | 221122 | 221122 | 221122 |
| 011000 | 221122 | 221122 | 221122 | 221122 |
| 010111 | 221122 | 221122 | 221122 | 221212 |
| 010110 | 221122 | 221122 | 221212 | 221212 |
| 010101 | 221122 | 221212 | 221212 | 221212 |
| 010100 | 221212 | 221212 | 221212 | 221212 |
| 010011 | 221212 | 221212 | 221212 | 221222 |
| 010010 | 221212 | 221212 | 221222 | 221222 |
| 010001 | 221212 | 221222 | 221222 | 221222 |
| 010000 | 221222 | 221222 | 221222 | 221222 |
| 001111 | 221222 | 221222 | 221222 | 222112 |
| 001110 | 221222 | 221222 | 222112 | 222112 |
| 001101 | 221222 | 222112 | 222112 | 222112 |
| 001100 | 222112 | 222112 | 222112 | 222112 |
| 001011 | 222112 | 222112 | 222112 | 222122 |
| 001010 | 222112 | 222112 | 222122 | 222122 |
| 001001 | 222112 | 222122 | 222122 | 222122 |
| 001000 | 222122 | 222122 | 222122 | 222122 |
| 000111 | 222122 | 222122 | 222122 | 222212 |
| 000110 | 222122 | 222122 | 222212 | 222212 |
| 000101 | 222122 | 222212 | 222212 | 222212 |
| 000100 | 222212 | 222212 | 222212 | 222212 |
| 000011 | 222212 | 222212 | 222212 | 222222 |
| 000010 | 222212 | 222212 | 222222 | 222222 |
| 000001 | 222212 | 222222 | 222222 | 222222 |
| 000000 | 222222 | 222222 | 222222 | 222222 |
| $D_1\ D_2\ D_3\ D_4\ D_5\ D_6$ | $S_{15}\ S_{14}\ S_{13}\ S_{12}\ S_{11}\ S_{10}$ | $S_{25}\ S_{24}\ S_{23}\ S_{22}\ S_{21}\ S_{20}$ | $S_{35}\ S_{34}\ S_{33}\ S_{32}\ S_{31}\ S_{30}$ | $S_{45}\ S_{44}\ S_{43}\ S_{42}\ S_{41}\ S_{40}$ |
| BIT + DATA | D/A CONVERTER 34A | D/A CONVERTER 34B | D/A CONVERTER 34C | D/A CONVERTER 34D |

TABLE 5

| 111111 | 111111 | 111111 | 111111 | 111112 |
|---|---|---|---|---|
| 111110 | 111111 | 111111 | 111112 | 111112 |
| 111101 | 111111 | 111112 | 111112 | 111112 |
| 111100 | 111112 | 111112 | 111112 | 111112 |
| 111011 | 111112 | 111112 | 111112 | 111122 |
| 111010 | 111112 | 111112 | 111122 | 111122 |
| 111001 | 111112 | 111122 | 111122 | 111122 |

TABLE 5-continued

| $D_1 D_2 D_3 D_4 D_5 D_6$ BIT + DATA | $S_{15} S_{14} S_{13} S_{12} S_{11} S_{10}$ D/A CONVERTER 34A | $S_{25} S_{24} S_{23} S_{22} S_{21} S_{20}$ D/A CONVERTER 34B | $S_{35} S_{34} S_{33} S_{32} S_{31} S_{30}$ D/A CONVERTER 34C | $S_{45} S_{44} S_{43} S_{42} S_{41} S_{40}$ D/A CONVERTER 34D |
|---|---|---|---|---|
| 1 1 1 0 0 0 | 1 1 1 1 2 2 | 1 1 1 1 2 2 | 1 1 1 1 2 2 | 1 1 1 1 2 2 |
| 1 1 0 1 1 1 | 1 1 1 1 2 2 | 1 1 1 1 2 2 | 1 1 1 1 2 2 | 1 1 1 2 1 2 |
| 1 1 0 1 1 0 | 1 1 1 1 2 2 | 1 1 1 1 2 2 | 1 1 1 2 1 2 | 1 1 1 2 1 2 |
| 1 1 0 1 0 1 | 1 1 1 1 2 2 | 1 1 1 2 1 2 | 1 1 1 2 1 2 | 1 1 1 2 1 2 |
| 1 1 0 1 0 0 | 1 1 1 2 1 2 | 1 1 1 2 1 2 | 1 1 1 2 1 2 | 1 1 1 2 1 2 |
| 1 1 0 0 1 1 | 1 1 1 2 1 2 | 1 1 1 2 1 2 | 1 1 1 2 1 2 | 1 1 1 2 2 2 |
| 1 1 0 0 1 0 | 1 1 1 2 1 2 | 1 1 1 2 1 2 | 1 1 1 2 2 2 | 1 1 1 2 2 2 |
| 1 1 0 0 0 1 | 1 1 1 2 1 2 | 1 1 1 2 2 2 | 1 1 1 2 2 2 | 1 1 1 2 2 2 |
| 1 1 0 0 0 0 | 1 1 1 2 2 2 | 1 1 1 2 2 2 | 1 1 1 2 2 2 | 1 1 1 2 2 2 |
| 1 0 1 1 1 1 | 1 1 1 2 2 2 | 1 1 1 2 2 2 | 1 1 1 2 2 2 | 2 1 1 1 1 2 |
| 1 0 1 1 1 0 | 1 1 1 2 2 2 | 1 1 1 2 2 2 | 2 1 1 1 1 2 | 2 1 1 1 1 2 |
| 1 0 1 1 0 1 | 1 1 1 2 2 2 | 2 1 1 1 1 2 | 2 1 1 1 1 2 | 2 1 1 1 1 2 |
| 1 0 1 1 0 0 | 2 1 1 1 1 2 | 2 1 1 1 1 2 | 2 1 1 1 1 2 | 2 1 1 1 1 2 |
| 1 0 1 0 1 1 | 2 1 1 1 1 2 | 2 1 1 1 1 2 | 2 1 1 1 1 2 | 2 1 1 1 2 2 |
| 1 0 1 0 1 0 | 2 1 1 1 1 2 | 2 1 1 1 1 2 | 2 1 1 1 2 2 | 2 1 1 1 2 2 |
| 1 0 1 0 0 1 | 2 1 1 1 1 2 | 2 1 1 1 2 2 | 2 1 1 1 2 2 | 2 1 1 1 2 2 |
| 1 0 1 0 0 0 | 2 1 1 1 2 2 | 2 1 1 1 2 2 | 2 1 1 1 2 2 | 2 1 1 1 2 2 |
| 1 0 0 1 1 1 | 2 1 1 1 2 2 | 2 1 1 1 2 2 | 2 1 1 1 2 2 | 2 1 1 2 1 2 |
| 1 0 0 1 1 0 | 2 1 1 1 2 2 | 2 1 1 1 2 2 | 2 1 1 2 1 2 | 2 1 1 2 1 2 |
| 1 0 0 1 0 1 | 2 1 1 1 2 2 | 2 1 1 2 1 2 | 2 1 1 2 1 2 | 2 1 1 2 1 2 |
| 1 0 0 1 0 0 | 2 1 1 2 1 2 | 2 1 1 2 1 2 | 2 1 1 2 1 2 | 2 1 1 2 1 2 |
| 1 0 0 0 1 1 | 2 1 1 2 1 2 | 2 1 1 2 1 2 | 2 1 1 2 1 2 | 2 1 1 2 2 2 |
| 1 0 0 0 1 0 | 2 1 1 2 1 2 | 2 1 1 2 1 2 | 2 1 1 2 2 2 | 2 1 1 2 2 2 |
| 1 0 0 0 0 1 | 2 1 1 2 1 2 | 2 1 1 2 2 2 | 2 1 1 2 2 2 | 2 1 1 2 2 2 |
| 1 0 0 0 0 0 | 2 1 1 2 2 2 | 2 1 1 2 2 2 | 2 1 1 2 2 2 | 2 1 1 2 2 2 |

Figure 8:
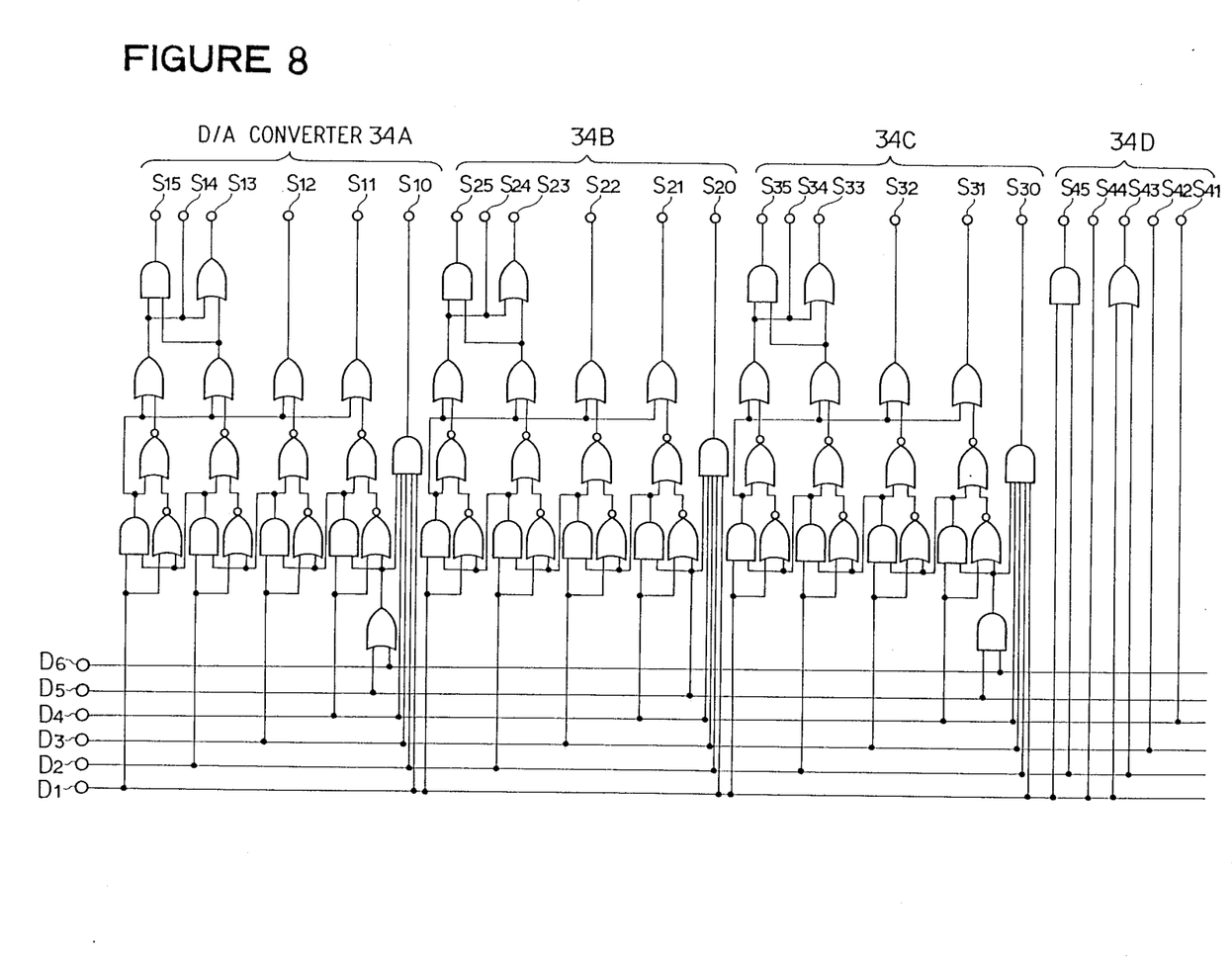
FIG. 8 is a diagram similar to FIG. 6 but showing a switch control signal generator incorporated in the A/D converter shown in FIG. 7.

FIG. 8 shows a circuit of the control signal generator 44 for controlling the switches $S_{10} \sim S_{15}$, $S_{20} \sim S_{25}$, $S_{30} \sim S_{35}$ and $S_{40} \sim S_{45}$ of the A/D converter shown in FIG. 7 in accordance with TABLE 4 and TABLE 5. Namely, the shown generator includes a number of AND gates, OR gates and NOR gates connected as shown to constitute a decoder which responds to the bit data $D_1 \sim D_6$ of the register 42 so as to generate control signals for all the switches $S_{10} \sim S_{45}$ in accordance with TABLE 4 and TABLE 5.

As will be apparent from the above description of the embodiments with reference to the drawings, a n-bit successive approximation A/D converter can be constructed by using $2^m$ l-bit local A/A converters (where $1 < n$, and $n = l + m$) in parallel so as to form a combined D/A converter, and by successively and alternatively incrementing the $2^m$ D/A converters so that the combined analog output is incremented. With the arrangement, the gain error of each D/A converter is uniformly distributed over the range from zero to the full scale. Therefore, a large gain error will not appear as a whole. In addition, the linearity error can be greatly improved.

Further, since there are used a plurality of D/A converter of the bit number smaller than a desired bit number, when the A/D converter is fabricated on an integrated circuit, it is possible to suppress an adverse effect of dispersion in characteristics of components formed on the integrated circuit.

The invention has thus been shown and described with reference to the specific embodiments. However, it should be noted that the invention is in no way limited to the details of the illustrated structures but changes and modifications may be made within the scope of the appended claims.

I claim:

1. An analog-to-digital converter which includes a plurality of digital-to-analog converting circuits, a control circuit connected to the digital-to-analog converting circuits to control the condition of the respective digital-to-analog converting circuits, a comparator having a first input connected commonly to outputs of the digital-to-analog converting circuits and a second input connected to receive a reference voltage, and a successive approximation register connected to an output of the comparator and adapted to control the control circuit, characterized in that the control circuit is adapted to generate control signals to the respective digital-to-analog converting circuits in one-to-one relation so that the output potentials of the digital-to-analog converting circuits are successively incremented one after one by a potential corresponding to one bit.

2. A converter as claimed in claim 1 wherein each of the digital-to-analog converting circuit includes a charge redistribution binary weighted capacitor array.

3. A converter as claimed in claim 2 wherein each capacitor array is composed of a plurality of sample and hold capacitors.

4. A converter as claimed in claim 2 wherein the second input of the comparator is connected to one terminal of a capacitor means whose other terminal is connected to the reference voltage, the capacitor means having a capacitance equal to the total capacitance of all the capacitors included in all of the digital-to-analog converting circuits.

5. An n-bit analog-to-digital converter which includes $2^m$ l-bit of digital-to-analog converting circuits (where $1 < n$ and $n = m + l$), a control circuit connected to the digital-to-analog converting circuits to control the condition of the respective digital-to-analog converting circuits, a comparator having a first input connected commonly to outputs of the digital-to-analog converting circuits and a second input connected to receive a reference voltage, and a successive approximation register connected to an output of the comparator and adapted to control the control circuit, characterized in that the control circuit is adapted to generate control signals to the respective digital-to-analog converting circuits in one-to-one relation so that the output potentials of the digital-to-analog converting circuits are successively incremented one after one by a potential corresponding to one bit.

6. A converter as claimed in claim 5 wherein each of the digital-to-analog converting circuit includes a charge redistribution binary weighted capacitor array.

7. A converter as claimed in claim 6 wherein each capacitor array is composed of at least (l+1) sample and hold capacitors.

8. A converter as claimed in claim 6 wherein each capacitor array is composed of (l+2) sample and hold capacitors.

9. A converter as claimed in claim 6 wherein the second input of the comparator is connected to one terminal of a capacitor means whose other terminal is connected to the reference voltage, the capacitor means having a capacitance equal to the total capacitance of all the capacitors included in all of the digital-to-analog converting circuits.

* * * * *